United States Patent [19]

Edgar et al.

[11] Patent Number: 5,414,378
[45] Date of Patent: May 9, 1995

[54] METHOD OF DETECTING VOLTAGE TRANSIENTS

[75] Inventors: Gregory A. Edgar, Richland Hills; Dan Huslig, Bedford, both of Tex.

[73] Assignee: Motorola, Inc., Schaumburg, Ill.

[21] Appl. No.: 894,304

[22] Filed: Jun. 4, 1992

[51] Int. Cl.⁶ .............................................. H03L 5/02
[52] U.S. Cl. .................................. 327/143; 327/312; 327/545
[58] Field of Search ................ 307/272.3, 296.6, 360, 307/273, 540, 542, 546, 296.1, 296.2, 296.3, 296.4, 310; 328/167; 327/143, 312, 545, 198, 544

[56] References Cited

U.S. PATENT DOCUMENTS

| | | | |
|---|---|---|---|
| 4,056,735 | 11/1977 | Caswell | 307/273 |
| 4,563,596 | 1/1986 | Gosselin et al. | 307/360 |
| 4,618,770 | 10/1986 | Maile | 307/360 |
| 4,849,662 | 7/1989 | Holberg et al. | 328/167 |

Primary Examiner—Timothy P. Callahan
Assistant Examiner—My-Trang Nu Ton
Attorney, Agent, or Firm—Kevin A. Buford

[57] ABSTRACT

A method and apparatus is provided for resetting an electronic device in response to a voltage transient. The apparatus implements the method steps of detecting the transient at an input to, and receiving an output from, a voltage sensing circuit in response to the transient. The method also includes the step of providing an electronic device reset signal at the output of the voltage sensing device by clamping the input of the voltage sensing circuit to the output of the voltage sensing circuit through an interconnected positive feedback clamping capacitor. Timing capacitors are used to extend the duration of the reset pulse.

5 Claims, 2 Drawing Sheets

METHOD OF DETECTING VOLTAGE TRANSIENTS

FIELD OF THE INVENTION

The invention relates to the detection of voltage transients and more specifically to a method of triggering reset devices within electrical circuits requiring such reset devices.

BACKGROUND OF THE INVENTION

Reset controllers and reset control circuits are known. Such controllers may be found within any microprocessor and microprocessor based circuit subject to disruption caused by power supply fluctuations. Areas of application of reset controllers may include consumer electronics equipment such as home computers or any other application where erroneous results may be associated with supply voltage fluctuations.

Reset controllers may be used within microprocessor circuits to generate a reset signal upon loss of power or upon a detected fault condition. Detected fault conditions may include out-of-spec supply voltages or transient on a supply voltage power bus that may affect microprocessor operation.

Prior art attempts to build reset controllers have included the stand-alone use of timing circuits such as the 555 timer or the Maxim Integrated Products, Inc. line of supervisory circuits (e.g. the MAX690). Reset controllers constructed exclusively of 555 timers work well on start-up by providing a time delay, deferring the start of data processing, until such time as steady-state conditions have been reached.

Problems arise, on the other hand, with reset controllers constructed of 555 timers under conditions of out-of-spec. supply voltages and high speed transients. A 555 timer may not function (time) properly with a supply voltage of less than 4.5 volts. A 555 timer may also fail to detect high speed transients (glitches greater than 1 MHz in frequency).

Reset controllers using a MAX690 (provided by Maxim Integrated Products) supervisory circuit performs better than a 555 timer under conditions of out-of-spec supply voltages. Included within the MAX690 is an internal reference voltage supply that may be used in conjunction with external resistors to detect out-of-spec. supply voltages.

A reset controller using the MAX690 supervisory circuit may achieve a desired reset time delay using an external capacitor. A reset controller may also achieve the desired time delay through use of additional 555 timers.

While the MAX690 performs considerably better than a 555 timer in detecting low voltage conditions the MAX690 is of limited value in detecting high speed transients. The response time of the MAX690, in fact, is listed as being 100 $\mu$s. Because of the importance of supply voltage control for microprocessors and microprocessor circuits a need exists for a reset controller that can detect low voltage conditions and glitches of less than 2.0 $\mu$s.

SUMMARY OF THE INVENTION

A method is provided for resetting an electronic device in response to a voltage transient. The method includes the step of detecting the transient at an input to, and receiving an output from, a voltage sensing circuit in response to the transient. The method also includes the step of providing an electronic device reset signal at the output of the voltage sensing device by clamping the input of the voltage sensing circuit to the output of the voltage sensing circuit through an interconnected feedback capacitor.

BRIEF DESCRIPTION OF A PREFERRED EMBODIMENT

The solution to the problem of resetting electronic devices during high speed glitches and low voltage conditions lies, conceptually, in the use of a voltage clamping circuit coupled to a reset timer. The voltage clamping circuit is comprised of a voltage clamping capacitor interconnected between an input and an output of a means for detecting out-of-spec supply voltage conditions (first voltage sensing device). The output of the first voltage sensing device is then applied as an input to the reset timer for temporally extending a RESET pulse provided by the voltage sensing circuit.

Figure 1:
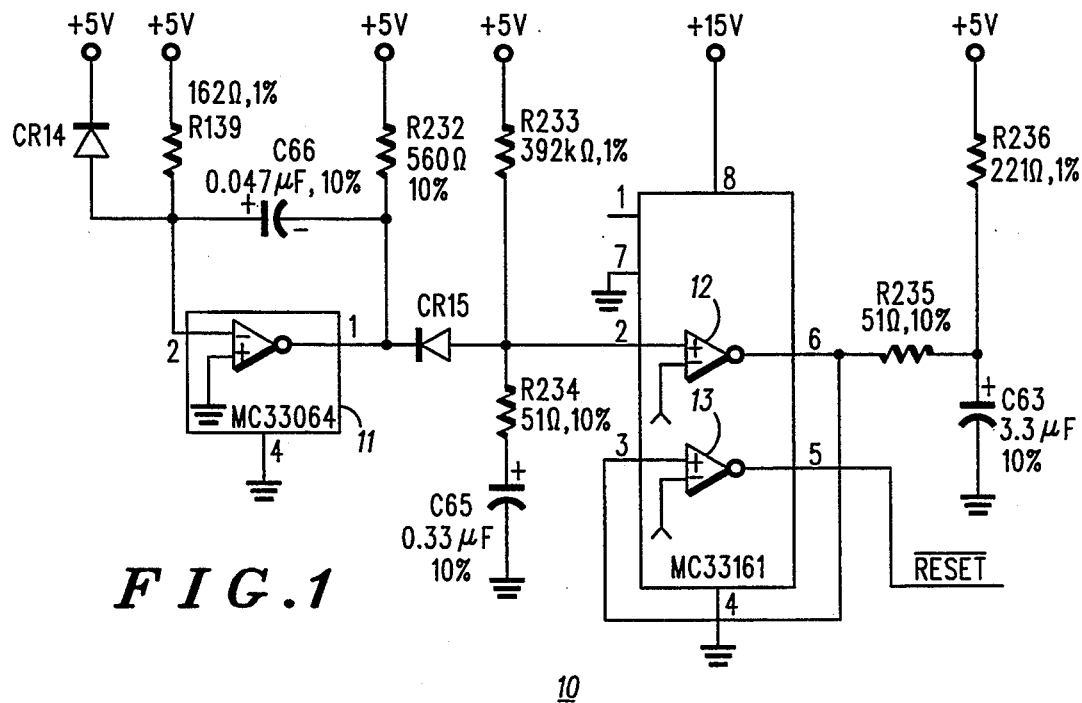
FIG. 1 depicts a circuit diagram of a reset controller, under the invention, including a reset circuit and a reset timer.

Shown in FIG. 1 is a reset controller (10), generally, in accordance with the invention. Included within the reset controller (10) is a voltage clamping circuit and a reset timer. The voltage clamping circuit is comprised of a first voltage sensing device (11), charging resistors (R139, and R232), discharge diode (CR14), and voltage clamping capacitor (C66).

The reset timer is comprised of a discharge diode (CR15), and a first and second timing RC circuits. The first RC timing circuit includes resistors R233 and R234, capacitor C65, and a second voltage sensing device (12). The second timing RC circuit includes resistors R235 and R236, capacitor C63, and an output voltage sensing device (13).

The voltage clamping circuit is beneficially used to trigger the reset timer upon the incidence of voltage transients as short as 1.6 $\mu$s. The reset timer then generates a desired reset delay (e.g. 100 msec.).

The first voltage sensing device (11) may be a MC33064 available from Motorola Inc. or equivalent. The second voltage sensing device (12) and output voltage sensing device (13) may be a MC33161 also available from Motorola Inc., or equivalent. Discharge diode (CR14) and charging diode (CR15) may be Schottky hot carrier diodes available from Motorola, Inc.

The reset controller (10) may have selected circuit values as follows:

| Device | Tolerance | Value |
|---|---|---|
| R139 | 162Ω | 1% |
| R232 | 560Ω | 10% |
| R233 | 392Ω | 1% |
| R234 | 51Ω | 10% |
| R235 | 51Ω | 10% |
| R236 | 221Ω | 1% |
| C63 | 3.3 $\mu$F | 10% |
| C65 | 0.33 $\mu$F | 10% |

| Device Tolerance | Value | |
|---|---|---|
| C66 | 0.047 μF | 10% |

From a deactivated state it can be assumed that the outputs of the voltage sensing devices (11, 12, and 13) begin in a low state and that capacitors (C63, C65, and C66) are discharged. As the power supply voltage begins to rise the input of the second voltage sensing device (12) is held in a low state by the output of the first voltage sensing device (11).

The output (RESET) of the reset controller (10) is held in a low state by the output voltage sensing device (13). The output voltage sensing device (13) is held in a low state by the output of the second voltage sensing device (12).

As the supply voltage at the input to the first voltage sensing device (11) rises above a first threshold value (minimum device activation value of 4.61 volts) the output of the first voltage sensing device (11) changes from a low state to a high state.

As the power supply voltage makes the transition from the deactivated state, of 0 volts, to 4.61 volts (and before the first voltage sensing device changes state), it can be assumed (depending on the rate of rise of the supply voltage) that the clamping capacitor (C66) charges from the deactivated state of 0 volts to +4.61 volts. At the instant that the output of the first voltage sensing device (11) changed from a low state to a high impedance state the clamping capacitor (C66) holds the open collector output (1) of the voltage sensing device (11) in a low state due to the 4.61 volt charge. (In the event a negative glitch occurs, discharge diode (CR14) provides a rapid discharge path of the clamping capacitor, (C66) allowing the voltage sensing device (11) to sense the glitch.) When the voltage sensing device (11) asserts the open collector (1) output (high impedance state), clamping capacitor (C66) discharges through R139 and R232.

Upon activation of the first voltage sensing device (11) a voltage value (clamping capacitor voltage minus discharge diode voltage) (4.50–3.9 v) is presented to the cathode of charging diode (CR15). The voltage value at the cathode of charging diode (CR15) allows capacitor C65 to begin charging through resistors R233 and R234. Charging of capacitor C65 continues until the voltage of capacitor C65 (as presented to the input of the second voltage sensing device (12)) exceeds a second threshold value (1.27 v) (typical MC33161 threshold voltage) of the second voltage sensing device (12). The time required for the voltage of capacitor C65 to rise to the second threshold value can be determined from the equation as follows:

$$t_1 = RC * \ln(V/(V - V_{thr}))$$

where R is a resistance value of the charging circuit, C is a capacitance value, and $V_{thr}$ is a voltage threshold value to which the capacitor charges. Substituting circuit values, as shown above, provides a minimum charge time for the first RC network of 3.77 msec.

As the second threshold is exceeded a transistor output (6) of the second voltage sensing device (12) turns "off" by changing from a state of low resistance to a state of high resistance. As the first output (6) of the second voltage sensing device (12) moves from low to a state of high resistance, capacitor C63 begins to charge.

Capacitor 63 begins to charge through resister R236 until the voltage across the capacitor (C63) exceeds the second threshold (1.27 v). The time required for the voltage across capacitor C63 to exceed the third threshold may be calculated using the above equation. Substituting values as shown in FIG. 1 provides a minimum charge time ($t_2$) for the second RC network of 142 msec.

The nominal total time delay upon activation of the reset controller (10) can be calculated by adding the values of $t_1$ and $t_2$. Nominal time delay, under the chosen values, equals 145.77 ms.

While nominal total time delay upon activation provides an indication of reset time provided by the reset controller (10) the time delay value in use must be analyzed under worst-case conditions (e.g. a fault condition). Worst-case analysis, for instance, would require that the time delay for the second RC circuit be calculated from actual discharge voltages of C63 and C65.

The actual discharge voltage in the case of C63 is measured by the maximum output voltage of the second voltage sensing device (12) in the "low" state. The typical "low" state voltage of the MC33161 is quoted (device specification) to be 0.2 v.

The actual discharge voltage for C65 is provided by the voltage drop across CR15 and the first voltage sensing device (11). The maximum discharge voltage considering typical values is 0.7 v.

Another factor to be considered in worst case analysis is that a RESET pulse from the reset controller (10) for the benefit of external devices such as microprocessors and controllers (not shown) should be beneficially in the 100 ms range under worst-case conditions (e.g. very fast transients). The 100 ms range under worst-case analysis should be maintained even including considerations of resistor/capacitor tolerances.

Using the values chosen for the second RC circuit (R236=221 Ω, −1% and C63=3.31 μF, −10%) and maximum supply voltage ($V_s$=5.2 v) provides a charge time (from 0 v to 5 v) of 117.46 seconds. Since only 100 ms is needed a maximum initial voltage for C63 may be calculated through the use of the equation:

$$V_{C63} = V_s e^{-t/RC}$$

Calculation of the value of $V_{C63}$ provides a maximum initial voltage of 0.2054 mV. Since the calculated value (0.2054 mV) exceeds the maximum output voltage (0.200 mV) of the second voltage sensing device (12), operation of the second RC circuit within the area of the 100 ms target is assured.

A further factor requiring investigation under worst-case analysis is the discharge time of the second RC circuit. The discharge time of an RC circuit may be calculated through use of the equation:

$$dt = (Cdv)/i$$

Maximum discharge time using such an equation is 0.99 ms.

Since the maximum discharge time for the second RC circuit is 0.99 ms, the maximum charge time for the first RC circuit (following detection of a fault) is also 0.99 ms. A calculation of the maximum charge time for the first RC circuit, using worst case analysis, produces a nominal time value of 1.459 ms (from an initial C65 voltage value of zero). Since the maximum charge time for the first RC circuit exceeds the maximum discharge time for the second RC circuit then a maximum initial voltage for C65 may be calculated. Using above equation ($V_C = V_s e^{-t/RC}$) the maximum initial voltage of C65 is 0.907 mV. Since the calculated maximum initial voltage of C65 is above the minimum discharge voltage allowed by the discharge path of C65 through CR15 and the first voltage sensing circuit (11), then a minimum charge time for the first RC circuit of at least 0.99 ms is assured.

The minimum discharge time of the first RC circuit may be calculated as above. Using worst case analysis produces a minimum discharge time of 12.75 μs.

To insure activation of the first RC circuit the voltage clamping circuit must provide a negative-going activation pulse of at least 12.75 μs in duration. The voltage clamping circuit provides such a negative-going pulse (for a reset period) through a charge accumulation on the voltage clamping capacitor (C66).

The voltage clamping capacitor (C66), as mentioned, during steady-state conditions has zero voltage maintained across capacitor terminals. Should a negative-going transient (fault) occur on the supply voltage, below at least 4.5 v magnitude, the output of first voltage sensing device (11) will go to a low state. The low state on the output of the first voltage sensing device (11) places a "zero" on the negative terminal (−) of the voltage clamping capacitor (C66). Since the voltage across the voltage clamping capacitor (C66) cannot change instantaneously, the input (2) to the first voltage sensing device (11) is also "pulled" (clamped) to a low value. The output of first voltage sensing device (11) remains in the low state (following detection of the fault) until such time as the positive terminal (+) of the voltage clamping capacitor (C66) charges to at least 4.5 v through charging resistor (R139) unclamping the input of the first voltage sensing device.

The time required to charge the voltage clamping resistor can be calculated using worst-case conditions for R139 (162 Ω −1%), C66 (0.047 μF −10%) and Vs (5.2 V). The calculated minimum charge time for the voltage clamping capacitor (C66) is 13.6 μs.

Since the calculated minimum charge time of the voltage clamping capacitor (C66) (13.6 μs) is greater than the minimum discharge time of the first RC circuit (12.75 μs), activation of the first and second RC circuits is assured upon detection of a fault. Activation of the first and second RC circuits, upon activation of the voltage sensing circuit, assures a reset pulse of 100 ms upon each detection of a fault condition on the power supply.

Detection of fault conditions (including a transient of 4.5 v, or below) by the voltage sensing circuit is assured by the discharge diode (CR15). The discharge diode remains de-activated until a forward bias voltage of 0.6 v appears across the terminals of the discharge diode. If C65 should have charged to 5.0 v, then a negative-going transient of at least 4.4 v would be required on the power supply to cause forward conduction of the discharge diode (CR15). Since the voltage sensing circuit detects faults of at least 4.5 v, detection of faults is assured without interference from the first RC circuit.

Also, since the clamping capacitor (C66), during steady-state conditions, has zero volts across its terminals, the input (2) and output (1) terminals of the voltage sensing device (11) substantially follows voltage transients occurring on the power supply. Since the input (2) of the voltage sensing device follows the power supply then performance characteristics of the voltage sensing circuit substantially equals specifications of the voltage sensing device (11).

Performance specifications for the voltage sensing device (11) (Motorola—MC33064) indicate a transient response time as short as 400 ns in response to a transient reaching 4.5 v. Experimentation with the reset controller (10), in fact, substantially equal device (11) reaction times. Transients as short as 0.65 μs on the power supply, applied to the reset controller (10), repeatable provide a 100 ms reset pulse at the output (RESET) of the reset controller (10).

Figure 2:
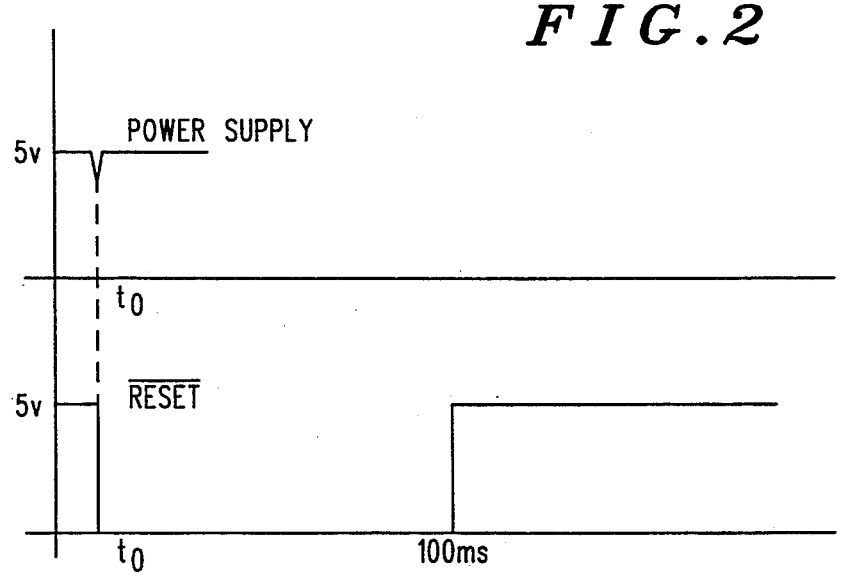
FIG. 2 depicts operation of the reset controller upon application of a transient.

Shown in FIG. 2 is a graphical representation of circuit (10) response to a high speed transient. As shown a transient on the power supply reaching 4.5 volts initiates a negative-going RESET pulse of substantially 100 ms in duration. The reset controller (10) therefore provides an effective means of detecting and resetting electrical circuits in the event of high-speed transients.

Figure 3:
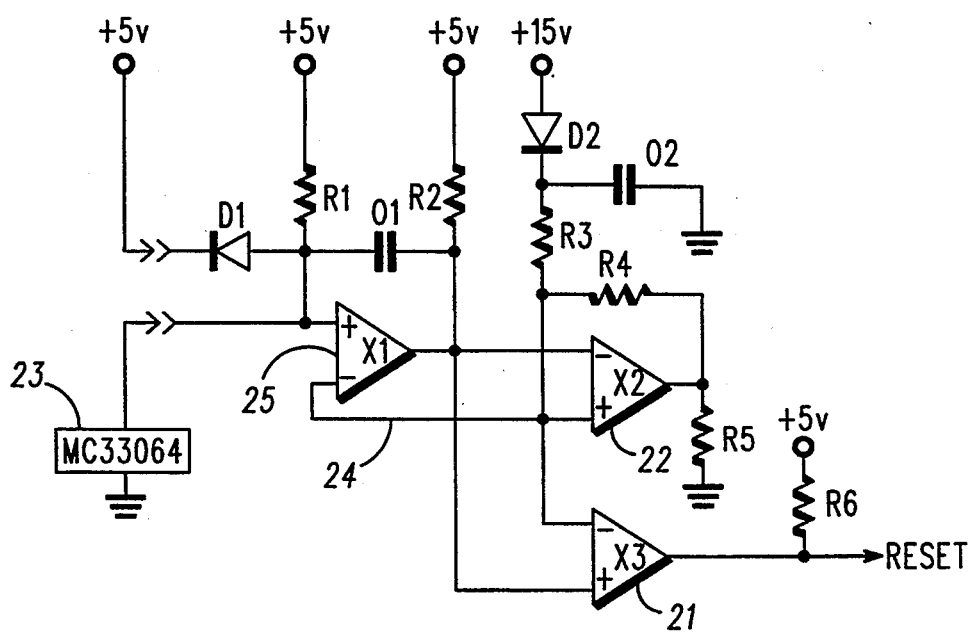
FIG. 3 depicts a circuit diagram of a reset controller using a variable voltage reference.

In another embodiment of the invention (FIG. 3) a reference voltage (24) is provided as an input to the voltage sensing device (25). The reference voltage (24) is derived within a voltage divider circuit (R3, R4, and R5) from a separate power supply (15 volt supply). The stability of the reference (24) is enhanced by a capacitor (C2) and diode (D2). The diode (D2) isolates the reference from the 15 volt power supply. The capacitor (C2) maintains the reference voltage (24) during power-down.

The reference output (24) of the voltage divider (R3, R4, and R5) is provided as an input (−) to a voltage sensing circuit (25). The voltage sensing circuit (25) compares the reference with the output of transient detector 23, or the supply voltage (+5 V) through optional diode D1. Since the reference voltage (24) may be adjusted by substitution of values within the divider circuit (R3, R4, and R5), the reset controller (20) may be adjusted to detect transients as small as 0.25 volt.

If the transient detector (23) is used, the voltage sensing circuit (20) is activated each time the transient detector (23) senses a transient. Upon activation the voltage sensing circuit (25) is latched in a reset state by a feedback capacitor (C1). The reset time is determined by an RC timing network (R1 and C1).

Where optional diode (D1) is used (in place of the transient detector (23)), activation of the reset controller (20) may be limited to transients known to affect the circuit protected. With the use of the optional diode (D1), activation of the voltage sensing circuit (25) is determined by a direct comparison of the reference voltage (24) with the +5 V supply voltage. The reference voltage (24) may be adjusted to an appropriate value through substitution of values within the divider (R3, R4, and R5).

We claim:

1. A method for resetting an electronic device in response to a voltage transient, such method comprising the steps of: detecting, with a voltage sensing device, a supply voltage transient; initiating a reset pulse in response to the supply voltage transient by the voltage sensing device; clamping an input of the voltage sensing device to an output through a clamping capacitor; charging the clamping capacitor to a voltage sensing device threshold value; unclamping the input of the voltage sensing device when an input voltage reaches a threshold voltage; and, terminating the reset pulse by the voltage sensing device when the input to the voltage sensing device is unclamped.

2. An apparatus for resetting an electronic device in response to a voltage transient, such apparatus comprising: detecting means for detecting a supply voltage transient; means for providing an output, defining the advent of a reset signal, from the detecting means in response to the supply voltage transient; means for clamping an input of the detecting means to the output through a clamping capacitor; means for charging the clamping capacitor to a detecting means threshold value through a charging capacitor; means for unclamping the input of the detecting means upon input voltage reaching a threshold voltage; and, means for providing an output at the output of the detecting means, defining an end of the reset signal, in response to the threshold voltage value at the input to the detecting means.

3. In a data processing system a reset circuit for detecting voltage transients of relatively short duration, such reset circuit comprising: a voltage sensing device having an input and an output; a diode between the input of the voltage sensing device and a voltage sensing device power supply; a capacitor between the output of the voltage sensing device and voltage sensing device ground; and, a positive feedback clamping capacitor between the input and output of the voltage sensing device.

4. The circuit as in claim 3 further comprising a resistor between the input of the voltage sensing device and the voltage sensing device power supply.

5. The circuit as in claim 3 further comprising a resistor between the output of the voltage sensing device and the voltage sensing device power supply.

* * * * *